United States Patent [19]

Whitney

[11] Patent Number: 5,479,238
[45] Date of Patent: Dec. 26, 1995

[54] HIGH RESOLUTION IMAGERY SYSTEMS AND METHODS

[76] Inventor: Theodore R. Whitney, 5500 Fenwood Ave., Woodland Hills, Calif. 91367

[21] Appl. No.: 379,359

[22] Filed: Jan. 27, 1995

Related U.S. Application Data

[62] Division of Ser. No. 897,248, Jun. 11, 1992, Pat. No. 5,386,319, which is a division of Ser. No. 520,629, May 8, 1990, Pat. No. 5,156,943, which is a division of Ser. No. 108,435, Oct. 25, 1987, Pat. No. 4,936,665.

[51] Int. Cl.$^6$ .................................................. G03B 27/00
[52] U.S. Cl. ........................... 355/53; 359/11; 359/27; 359/28; 359/599
[58] Field of Search ................................ 359/10, 11, 27, 359/28, 30, 599

[56] References Cited

U.S. PATENT DOCUMENTS

| | | | |
|---|---|---|---|
| 3,677,616 | 7/1972 | Lewis | 359/28 |
| 3,754,814 | 8/1973 | Leith | 359/599 |
| 4,032,343 | 6/1977 | Deml et al. | 430/397 |
| 4,057,326 | 11/1977 | Knop | 359/568 |
| 4,155,630 | 5/1979 | Ih | 359/10 |
| 4,277,138 | 7/1981 | Dammann | 359/569 |
| 4,435,041 | 3/1984 | Torok et al. | 359/573 |
| 4,637,697 | 1/1987 | Freeman | 351/161 |
| 4,704,033 | 11/1987 | Fay et al. | 356/363 |
| 4,721,362 | 1/1988 | Brody et al. | 359/7 |
| 4,748,614 | 5/1988 | Dammann et al. | 359/130 |
| 4,851,978 | 7/1989 | Ichihara | 355/67 |
| 4,936,642 | 6/1990 | Hung et al. | 359/28 |
| 5,124,815 | 6/1992 | Chang | 359/10 |
| 5,390,023 | 2/1995 | Biegen | 356/359 |

FOREIGN PATENT DOCUMENTS

| | | | |
|---|---|---|---|
| 83 06227 | 10/1983 | France | G02B 27/42 |
| 60-247611 | 7/1985 | Japan | G02B 13/00 |

OTHER PUBLICATIONS

Weingärtner, I., "Measurement of Mutual Coherence Functions by Image Holography", Journal of Optical Soc. of America, vol. 60, pp. 572–573, Apr. 1970.

Dainty, J. C., et al., "Reduction of Speckle in Image Plane Hologram Reconstruction by Moving Pupils", Optics Communications vol. 3, No. 5, pp. 289–294.

Kenro Miyamoto, "The Phase Fresnel Lens", *Journal of the Optical Society of America*, vol. 51, No. 1, Jan. 1961, pp. 17–20.

Melvin H. Horman, "Efficiencies of Zone Plates and Phase Zone Plates", *Applied Optics*, vol. 6, No. 11, Nov. 1967, pp. 2011–2013.

S. Mallick, "Degree of Coherence in the Image of a Quasi–Monochromatic Source", *Applied Optics*, vol. 6, No. 8, Aug. 1967, pp. 1403–1405.

Bryngdahl, "AXICON", IBM Technical Disclosure Bulletin, vol. 13, No. 1, Jun. 1970, p. 81.

H. H. Hopkins, Wave Theory of Aberrations, (Oxford at the Clarendon Press, 1950), pp. 47–55.

(List continued on next page.)

Primary Examiner—Paul M. Dzierzynski
Assistant Examiner—John Juba, Jr.
Attorney, Agent, or Firm—Merchant, Gould, Smith, Edell, Welter & Schmidt

[57] ABSTRACT

The current limits of resolution of multi-element optical systems are exceeded by reducing the number of elements while introducing at the critical aperture a blazed transmission grating having grating rings of low bending power defined by multiple plateaus. By illuminating the optical train with monochromatic light that constitutes a multiplicity of distributed sources having a substantial temporal coherence but spatial incoherence and by varying the slopes and widths of the grating rings, local phase delays are introduced that adjust aberrations in the optical system, providing an aligned composite wavefront. The system and method may be used for presenting an image, as for a wafer stepper, or for viewing an image, as in a microscope.

4 Claims, 8 Drawing Sheets

OTHER PUBLICATIONS

Keivin Burns, et al., "Energy Levels and Wavelengths of the Isotopes of Mercury–199 and –200", *Journal of the Optical Society of America*, vol. 62, No. 10, Oct. 1952, pp. 717–718.

John M. McLeod, "The Axicon: A Type of Optical Element", *Journal of the Optical Society of America*, vol. 44, No. 8, Aug. 1954, pp. 592–597.

H. Madjidi–Zolbanine et al., "Holographic correction of both chromatic and spherical aberrations of single glass lenses", *Applied Optics*, vol. 18, No. 14, Jul. 15, 1979, pp. 2385–2393.

H. Dammann, "Blazed Synthetic Phase–Only Holograms", *Optik 31*, Heft 1,1970, Seite 95–104.

E. G. Loewen et al, "Grating efficiency theory as it applies to blazed and holographic gratings", *Applied Optics*, vol. 16, No. 10, Oct. 1977, pp. 2711–2721.

Philip S. Considine, "Effects of Coherence on Imaging Systems", *Journal of the Optical Society of America*, vol. 56, No. 8, Aug. 1966, pp. 1001–1009.

C. S. Ih et al, "Improved random spatial phase modulation for speckel elimination", *Applied Optics*, vol. 17, No. 9, May 1, 1978, pp. 1447–1454.

Brian J. Thompson, "Diffraction by Semitransparent and Phase Annuli", *Journal of the Optical Society of America*, vol. 55, No. 2, Feb. 1965, pp.145–149.

W. T. Welford, "Use of Annular Apertures to Increase Focal Depth", *Journal of the Optical Society of America*, vol. 50, No. 8, Aug. 1960, pp. 749–753.

S. C. Som, "Influence of Partially Coherent Illumination on the Performance of Non–Airy Pupil Functions in Microscopic Systems", *Applied Optics*, vol. 11, No. 3, Mar. 1972, pp. 655–661.

T. Fujita et al, "Blazed gratings and Fresnel lenses fabricated by electron–beam lithography", *Optics Letters*, vol. 7, No. 12, Dec. 1982, pp. 578–580.

S. K. Case, et al, "Multifacet holographic optical elements for wave front transformations", *Applied Optics*, vol. 20, No. 15, Aug. 1, 1981, pp. 2670–2675.

Jean Claude Fouere et al, "Focusing Errors in a Collimating Lens or Mirror: Use of a Moire Technique", *Applied Optics*, vol. 13, No. 6, Jun. 1974, pp. 1322–1326.

T. C. Chang et al, "System for Aligning and Decentering Using Moire Technique", *Journal of the Optical Society of America*, 1983 Annual Meeting, p. 1911.

FIG. 3
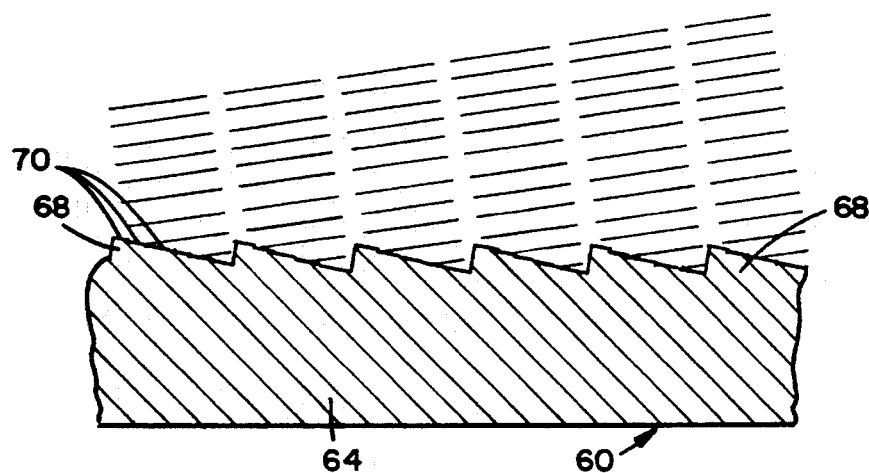
FIG. 4
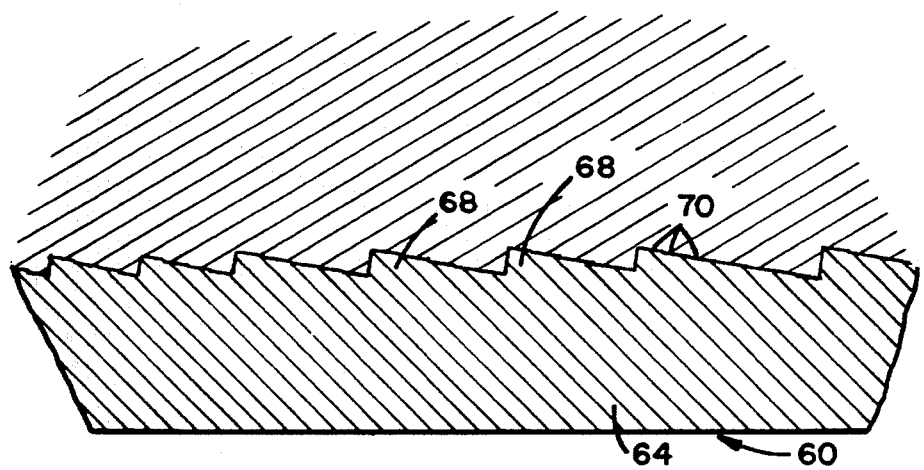
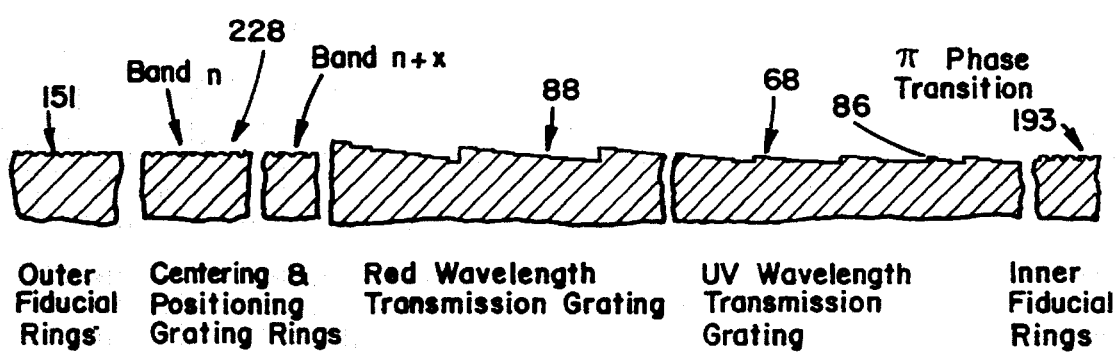
FIG. 5

HIGH RESOLUTION IMAGERY SYSTEMS AND METHODS

This is a division of application Ser. No. 07/897,248, filed on Jun. 11, 1992, for HIGH RESOLUTION IMAGERY SYSTEMS AND METHODS, now U.S. Pat. No. 5,386,319, which is a divisional of application Ser. No. 07/520,629, filed on May 8, 1990 for HIGH RESOLUTION IMAGERY SYSTEMS AND METHODS, now U.S. Pat. No. 5,156,943, which is a divisional of application Ser. No. 07/108,435, filed on Oct. 25, 1987 for HIGH RESOLUTION IMAGERY SYSTEMS AND METHODS, now U.S. Pat. No. 4,936,665.

BACKGROUND OF THE INVENTION

The use of high resolution optical imagery systems, as in photolighographic systems for the semiconductor industry and microscope systems for a wide variety of applications, has continued to grow despite the availability of other technologies, such as high resolution systems based upon atomic particle matter typified by electron beams or X-rays. The greater cost and lower operating convenience of these latter systems, as well as the longer times required for the formation of images, establish that the optical imagery systems will remain preferable for many applications for the foreseeable future. However, constantly increasing requirements for more precise technology have taken the optical imagery systems virtually to the limits of resolution values which can be achieved with refractive optics. For example, very large scale integrated circuits are constantly being reduced in size and made with higher component density, an objective measure of which is the minimum linewidth specification. Whereas one micron linewidths were suitable until recently, present objectives in the industry contemplate linewidths well down into the submicron category, of less than 0.5 microns and even 0.3 microns. This requires a line resolution for a refractive optical system of the order of several thousand lines per millimeter, which has not heretofore been achievable with an optical imaging system of suitable aperture and depth of field.

In response to these problems the optical industry has devised progressively more sophisticated multi-element lens systems using advanced lens design computer programs. The advanced level of the state of the art is exemplified by the so-called "i-line" lens system, which utilizes a complex configuration of some twenty refractive elements of highest quality glasses. The best that this system can achieve, however, is in the range of 0.7 micron linewidth resolution, because the multiple factors involved in complex lens design (chromaticism, coma, astigmatism, spherical aberration being included), together with the problems of achieving sufficient uniformity and adequate wave energy at the target, establish ultimate limitations that are presently at about 0.7 micron linewidth. There are also inherent limitations on manufacture when dealing with this order of precision. For example, the best diamond turning procedures still leave optical surfaces too rough for operation at short wavelengths (e.g. ultraviolet).

The semiconductor industry, however, has devised many production and inspection procedures based upon optical imaging systems, and would prefer to use these for the specific advantages they provide. For example, in preparing the successive layers on a silicon or other wafer, a "wafer stepper" system is employed incorporating the high resolution refractive optics. There is a different precision photomask for each layer to be formed. The wafer is first covered with a layer of photosensitive material of the type on which an image can be fixed by exposure to a suitable amount of light energy. The wafer stepper mechanism then precisely and sequentially places the wafer at chosen matrix positions relative to an optical axis. At each position in the matrix pattern on the wafer, an exposure is made through the photomask, with the optical system typically reducing the image a selected amount, usually five or ten times. Inherent requirements for this type of system are that the light energy be adequate for each exposure, that the exposed image be uniform across the image, that the depth of field be sufficient and that the resolution meet the specifications of the design. These requirements are not easily met in combination, because the very small size of the images and the extreme precision that are required greatly restrict the design alternatives that are available. Once the exposure is made at all positions in the matrix and the unfixed material is washed off, the images can be checked for accuracy and uniformity of reproduction. Optical microscopes are usually employed for checking, on a statistical basis, the characteristics of the various images. The inspection may comprise one or more of a combination of procedures involving automatic or operator measurement of linewidths or other characteristics, but all of these procedures entail precise and high resolution magnification of the image.

The problems of obtaining higher resolution optical imagery systems of practical application thus appear to have approached a limit. Whether or not such limit ultimately is found to be insurmountable with more complex multi-element lens systems remains to be seen. Some substantially different approach appears to be needed, however, that would free optical imagery systems from the constraints on design and manufacture that are inherently imposed in reconciling many higher order terms involved in optical design equations. Tentative movements in this direction were made a number of years ago in proposals that an aspherical element of a special character be introduced into the lens system. These proposals are best evidenced in an article by Kenro Miyamoto entitled "The Phase Fresnel Lens", presented at the November 1960 meeting of the Optical Society of American and subsequently published in the *Journal of the Optical Society of America*, January 1961, pp. 17–20. In that article, Miyamoto also reference earlier articles of philosophically similar nature. He principally suggested that a "phase Fresnel lens" be inserted in the pupil plane of an optical system to deform the wavefront surface passing therethrough so as to compensate, for example, for spherical aberration. His proposals were general in nature with no consideration being given to problems of achieving high transmission efficiency, high resolution such as would approach the needs of the semiconductor industry, or adequate depth of field. Miyamoto, in an example, suggested the use of single layer thin film rings of a minimum radial dimension of 0.63 mm. He did not address the difficulties involved in fabricating a more precise system, i.e. a blazed transmission grating.

Miyamoto asserts that a phase Fresnel lens can be made to deform a wave surface by an amount:

$$\phi(u,v)-(k-1)$$

where $K=1, 2,...m$, where the amount of deformation in all zones is smaller than $\lambda$, by depositing a (single) thin film covering various circular zones. He then asserts that a wave surface thus deformed is "quite equivalent" to a lens which deforms the wave surface by the amount $\phi(u,v)$.

His equations describe a perfectly blazed phase grating yet his description of his method using a single thin film leads to the creation of a binary phase grating, which might also be called a "phase reversal zone plate". This type of grating can only function to provide alternation of phase delays between two values.

The phase reversal zone plate was studied by Melvin H. Horman in an article entitled "Efficiencies of Zone Plates and Phase Zone Plates", published in *Applied Optics*, November 1967, pp. 2011–2013. Horman defines the efficiency of a zone or phase plate as the "percentage of the flux in the illuminating wavefront which goes to their principal images", and using this definition he gives the first order efficiency of the phase reversal zone plate as 40.5%. Horman notes that the efficiency of a phase Fresnel lens, if it could be built, would approach 100%. Fabrication of a phase Fresnel lens of high efficiency, working in conjunction with highly corrected optics, however, has apparently not been attempted or reported in the intervening years. Triangular profile plates for independent use as microlenses have been made for certain applications.

The Miyamoto proposal thus is recognized as offering the possibility for greater freedom of lens design, but as far as is known from the literature was never implemented. This was probably due to a combination of reasons including limitations perceived as to the advantages to be derived, the difficulty of fabrication of the phase Fresnel lens in the form described, other advances in optical design using solely refractive optics, and a lack of appreciation of much more complex factors inherent in the problem. For example, there can be a substantial variation in efficiency between the parallel and orthogonal components of incident light, with grating blaze angle. Also, Miyamoto failed to appreciate, or at least discuss, the important role that temporal coherence of the individual spectral components plays in maintaining the resolution or space-bandwidth product of a phase Fresnel lens. It is shown hereafter that by properly considering, in the manipulation of wavefront aberration, factors including wave component distributions, the precise distribution of the illuminating energy, and local, temporal and spatial rearrangement of phase relationships, together with a coactive refractive lens configuration, the resolution of an optical imagery or readout system can be increased beyond levels previously thought unattainable, with useful depth of field and high efficiency.

The same principles upon which high resolution optical imagery of readout can be achieved by combinations of phase gratings and optical refractive elements can also be used in other optical applications. These include microscopy and optical transform functions, conical axicon phase gratings in combination with a spherical object lens, cylindrical phase gratings in combination with conventional cylindrical lenses, and toroidal aspheric grating lenses. Conical axicon phase gratings can be particularly useful in combination with optical refractive elements to provide a narrow line of light of predetermined length for an optical disk recording or readout device, eliminating the need for an autofocus system. The ability to precisely correct wavefront aberrations can in other words be of potential benefit wherever refractive optics limits are approached provided that the particular spectral characteristics of phase plates are recognized and accounted for in the system design.

SUMMARY OF THE INVENTION

Systems and methods in accordance with the invention dispose at least one holographic areally distributed transmissive grating element in the optical train of a refractive optical system, one of the elements usually being at the aperture stop. The grating element and other components are illuminated monochromatically by a multiplicity of distributed spatially incoherent but temporally coherent sources in such manner as to introduce incrementally varying phase retardation. These incremental variations vary nonlinearly but in controlled fashion throughout the illuminating field, forming a composite wavefront which compensates for selected aberrations. In an optical imaging system the compensation is not only for predetermined spherical aberration but also predetermined chromatism in the refractive optics. Wave retardation is effected by a transmission grating having segments defined by multiple plateaus varying by fractional wavelength increments that provide high efficiency diffraction. Areal organization of the segments may include phase reversals and transmissivity changes to modify the wavefront component interactions so as to create a number of interrelated pupils whose composite effect can be, for example, increased depth of field, better contrast, and improved resolution.

In one general example of an imaging system, an illuminator is employed that comprises a monochromatic light source, means for distributing the beam evenly throughout an extended beam area and means for establishing temporal coherence of the waves at above a predetermined minimum, but with spatial coherence effectively eliminated. The phase plate in this instance comprises a light transmissive element having a plurality of concentric rings, each having multiple plateaus varying by incremental wavelength fractions, the plateaus of a ring together providing low angle bending of the local wavefront. The phase plate is disposed at the aperture stop of a refractive optics system, the design of which is integrated with the phase plate and thereby simplified. The refractive optics may, for example, include a collimating lens portion and an objective lens portion but is typically designed with relatively few elements having known but limited aberrations acceptable within overall limits for the system. The phase plate is fabricated by microlithographic techniques so as to provide rings of varying radii with successive plateau levels within each ring. By changing the step relationship of plateaus in different ring groupings the phase relationship of waves passing through different subdivisions of the phase plate is selectively reversed to provide a number of pupils. Some rings or groups of rings may be rendered opaque or partially transmissive so that light from certain areas can be blocked or attenuated. Thus the spatial distributions and phase relationships of the illumination from the multiplicity of light sources are restructured so that the composite waveform is precisely reconstituted to cancel out the permitted aberration in the refractive optics. By this system and method resolution of the order of 2,500 lines per millimeter, high efficiency transmission, high depth of field and excellent contrast are achieved. The refractive optics used in the system not only require substantially fewer elements but the design procedure can accommodate greater tolerance for specific characteristics, such as spherical aberration and chromaticity.

To achieve high beam intensity, evenness of intensity distribution, and achromatism a pulsed laser is a preferred illuminator source for semiconductor fabrication operations. However other sources, such as mercury arc systems, can be used in conjunction with conventional methods for overcoming intensity distribution, filtering and chromatism problems.

In accordance with further features of the invention, the illuminator in one specific example comprises an excimer laser and etalon tuning cavity combination operating in the ultraviolet range, as at 248 nm, to provide bursts of light energy that have temporal coherence to in excess of 50,000 waves. The bursts of illuminating light energy are passed through a phase randomizer comprising a pair of spaced apart random phase plates and an intermediate beam shifting device which distributes spatially incoherent multiple light sources in a statistically uniform manner at the photomask or object plane. The phase plate is configured to provide on the order of 3° of light bending, with high efficiency transmission of first order waves, and in a preferred configuration includes a six zone-pupil configuration defined by segments of alternating phase, achieved by selective reversal of the plateau progressions in the phase plate subdivisions. More than one phase plate can be arranged in a system, with one being disposed at the aperture stop and the others adjacent along the beam path to provide particular aspheric characteristics. With a 248 nm source, the maximum thickness of the phase plate plateau regions is limited to approximately 0.427 microns, the individual plateaus being only of the order of 1.5 microns wide at the narrowest ring. The temporal coherence in the wavelets is maintained at approximately 50 times greater, or more, than the maximum phase delay introduced by the multi-plateau regions.

A number of different systems in accordance with the invention illustrate the versatility of the concept. In a microscope system, for example, light directed from an illuminator system onto an object under examination is imaged with higher resolution than heretofore by using a phase plate which is at the aperture stop and compensates for aberrations of refractive elements in the system, as well as spherical aberrations introduced by a transparent cover plate over the specimen under examination. In an axicon type of system, a phase plate in accordance with the invention is configured to cooperate with one or more spherical elements so as to bring planar waves into conical focus. The converging waves create the relatively long needle of light along the optical axis that characterizes the axicon design. In the cylindrical lens system, wavefront compensation is effected by parallel rather than concentric plateaus, again for higher resolution and precision.

Further, the phase plate may advantageously include an outer annular region of concentric rings defining separate light bending gratings and fiducial patterns. Coherent light of a different wavelength (e.g. a red wavelength) than the image wavelength can be transmitted through different portions of this outer annular region for use in alignment of the target surface relative to the projected image, without affecting the photosensitive surface.

Phase plates in accordance with the invention are fabricated by preparing photomasks or direct writing to define ring patterns of desired character for each of a succession of deposition or etching steps, preferably arranged in binary progression. For example, three successive steps can be used to define deposition layers for one, two and four plateau heights, to provide cumulatively a progression of from zero level to seventh level plateaus, using a series of three photoresist, wash and deposition subsequences. Each deposition subsequence may, for example, add an incremental fraction of a wavelength difference of high purity silica, with predetermined radial variations between the rings. Thus a phase plate may be constructed having approximately 1,600 rings, each of eight plateau levels, on an element of the order of 10 centimeters in diameter. This size is of the range needed for current wafer stepper equipment that can produce the large wafers and high resolution required for modern semiconductor products. A complementary binary sequence may alternatively be used, but based upon etching instead of deposition of the layers.

The outer annular rings used with a second wavelength source for target alignment are similarly formed, recorded from the phase mask or written directly at the same time as the rings in the image area. The outer rings are however deposited separately because the wavelength and consequently the required layer thicknesses are different.

A slightly smoother and more efficient blaze angle may be formed on the grating by creating a succession of 16 plateau heights using four binary masks to define a progression from 0 to 15 levels sized to create optical phase delays from 0 to $15/16$ wavelength. Similarly, coarser and less efficient gratings may alternatively be created for specific applications using only four plateau levels.

Different sets of diffractive or reflective rings are also advantageously deployed on the phase plate. For this purpose the element is initially overlaid, at least in certain regions, with a base (e.g. chrome) layer. The rings are defined by scribing during rotation or by photo-etch techniques.

One set of rings forms a number of groups of lens centering and spacing gratings. These gratings are positioned and specially configured with respect to different individual lens elements, or subgroups of the lens elements. They provide a focused beam at the optical axis when collimated light is directed through them at the critical aperture and the lens elements in the chosen lens subgroup are properly positioned. Thus the centration and axial position of each lens can be precisely referenced as it is added into the assembly.

A second set of reflective rings is initially written as an outer peripheral grouping concentric with a nominal axis that is to serve as the center for subsequent patterns. This ring set serves as a fiducial reference for photomasks or for compensating for eccentricity of the phase plate when separate tracks are being directly written during fabrication of the phase plate in a rotating system.

The precision required in placing the multi-plateau rings on the phase plate in order to achieve sub-micron resolution imposes very stringent requirements on whatever writing technique is used. These requirements are met utilizing the phase plate itself, by generating a third set of reflective rings near the center. Although the center of rotation is initially arbitrarily chosen, within limits, its position is precisely determined after writing of the reflective rings by scanning the rings on both sides of the center line while taking wave fringe measurements with an interferometer as each reflective ring is passed. Using the inner rings and outer rings in similar fashion, a precise reading can also be obtained of the number of fringes between their nominal positions. From these readings, calibrations can be made using precise corrections for immediately existing temperature, pressure and velocity of light, so that rings can be placed with an accuracy of the order of $1/30$ micron.

A particularly effective direct writing system in accordance with the invention uses an air spindle supported by air bearings on a base. A unidirectionally movable carriage is shifted relative to the spindle by a control system to different track writing positions for a writing laser beam. An eccentricity sensor system mounted adjacent the spindle projects an image of the outer fiducial rings onto a pattern and detects sinusoidal variations in the resultant signals when the phase plate is not precisely centered. The signal variations are used to deflect the laser writing beam so as to compensate for eccentricity variations during rotation. The peripherally supported phase plate can be adjusted to within the range of 1 micron by visual means, and the eccentricity correction can bring this down to about 0.1 microns or less. This system improves the precision with which individual phase plates can be fabricated so as to correct for specific lens assemblies, beyond the precision of a conventional contact printing process. Also, because the phase plates can be placed on and removed from the air spindle for application of photoresist, processing and deposition or etching without incurring large centration or cumulative errors.

BRIEF DESCRIPTION OF THE DRAWINGS

A better understanding of the invention may be had by reference to the following description, taken in conjunction with the accompanying drawings, in which:

FIG. 3 is a side sectional, fragmentary view of a portion of the phase plate, showing plateau variations therein and compensation of wavefront variations;

FIG. 4 is another side sectional fragmentary view similar to FIG. 3, but showing a different aspect of wavefront compensation;

FIG. 5 is an enlarged side sectional fragmentary representation of a phase plate illustrating the inner and outer grating rings in addition to the plateaus;

DETAILED DESCRIPTION OF THE INVENTION

Figure 1:
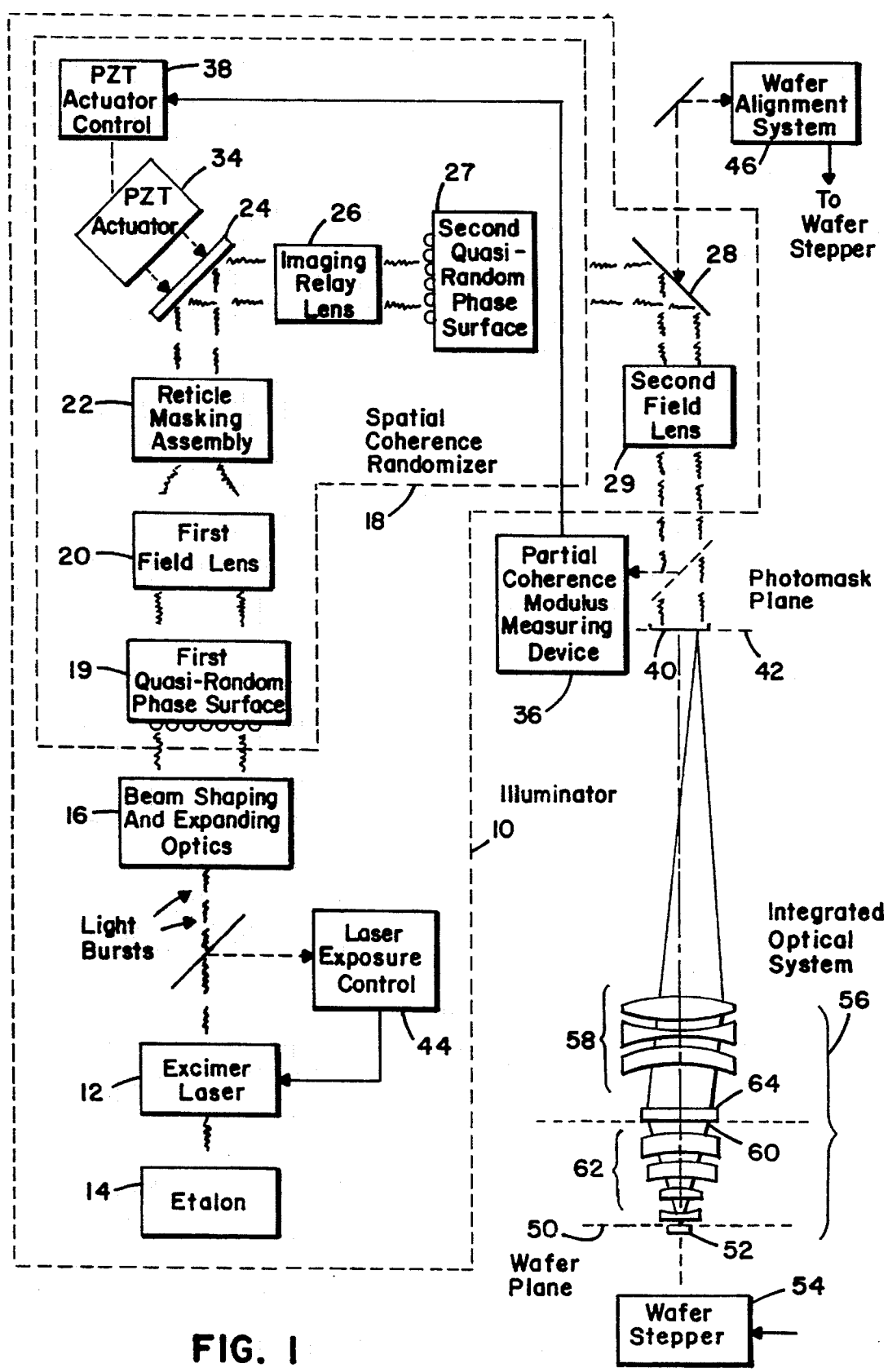
FIG. 1 is a simplified schematic and block diagram view of the principal elements of a system in accordance with the invention incorporating an illuminator and a phase plate.

The schematic and generalized representation of FIG. 1 cannot, because of differences in scale and proportion, depict both the larger elements of the system and the microdistribution of the wave energy and its spatial disposition within the system. Reference must be made to other Figures for a better understanding of such features and relationships, even though such Figures also cannot present relative sizes in a way which preserves true proportions.

The system is depicted as arranged for use with an optical imagery unit such as a wafer stepper, for adequately illuminating a photoresist surface with an extremely detailed very high resolution image. Details of the control, positioning, autofocus and associated mechanisms of the wafer stepper are known and are not included for brevity. Energizing light of a specific character is generated starting with an illuminator 10 including an excimer laser 12 of the KrF type, generating a rectangular beam of approximately Gaussian distribution at 248 nm in the ultraviolet region. The excimer laser 12 generates a pulse series, at approximately 150 pulses per second, each pulse being of $1.2 \times 10^{-8}$ seconds in duration and about 375 mJ/pulse. As is shown hereafter, this system can direct radiation of sufficient intensity onto a photoresist layer to record an image, and can do so within a usefully short time since the optical imaging system is of sufficiently high efficiency. A suitable laser of this type is provided by the Lumonics Hyperex-460 Model HE-SM excimer laser, although a number of other systems are available that can be utilized with appropriate recognition of various factors enumerated hereafter.

The beam from the laser 12 is spatially coherent to a substantial degree, and temporally coherent to about 1 part in 620, factors which are not consistent with the spatial and temporal distributions desired. Accordingly, the laser 12 operates in conjunction with a resonant tuning cavity, generally referred to as an etalon 14, which can raise the Q and the predictability of the lightwave train to be in step for as much as 124,000 wavelengths. Alternatively a laser with intracavity etalon tuning may be used to produce the same degree of temporal coherence. However, excessive tuning is not desirable because of the possibility of introduction of interference fringe effects, so that the etalon 14 is slightly detuned to reduce the temporal coherence to in the range of 1 in 10,000 wavelengths. The reasons for such modifications are discussed in more detail hereafter.

After emergence from the laser 12 the beam is enlarged in a double-prism beam expander 16 which turns the rectangular beam of the excimer laser 12 into a square beam about 1" on a side. This beam passes into a spatial coherence randomizer 18 which includes a first quasi-random phase surface 19 defined by quasi-random patterns of $SiO_2$ deposited on an $SiO_2$ substrate. The randomizer 18 structure provides a light transmissive element that imparts a degree of phase randomization across its cross-sectional area. Such a quasi-random phase surface may be achieved by evaporated patterns having average thicknesses of about 1 micron and average widths of about 10 microns. A first field lens 20 transfers the beam to a reticle masking assembly 22 which may, if desired, be motor driven. The masking assembly 22 limits the beam peripherally to a controllable object field outline of a selectable size, the beam then passing through onto a movable corner mirror 24 that is dynamically shifted through a small arc as described below. From this corner mirror 24 the beam is directed through an imaging relay lens 26 which images the first quasi-random surface 19 onto a second quasi-random phase surface 27 of similar character. The beam then passes onto a beam combining corner mirror 28 toward the associated optics including a second field lens 29 and to the wafer plane to which the image is directed. This angled beam path enables the laser 12, which requires substantial power and volume, to be placed well away from the image forming part of the system.

The second quasi-random phase surface 27 introduces further randomization, effectively multiplying the spatial phase randomness characteristic throughout the beam distribution. However, it is desirable to be able to vary the degree of randomness, and for this purpose partial coherence modulus measuring device 36 employing a Savart plate and Soleil compensator is positioned to sense this characteristic of the beam from the randomizer 18. Such a device may be arranged in accordance with the disclosure in an article entitled "Degree of Coherence in the Image of a Quasi-Monochromatic Source", by S. Mallick in *Applied Optics*, Vol. 6, No. 8, for August 1967, pp. 1403–1405. The device 36 returns a signal responsive to partial coherence modulus to a control circuit 38 which operates a PZT actuator 34 coupled to the movable corner mirror 24. In accordance with partial coherence contrast readings taken by the measuring device 36, the actuator control 38 energizes the PZT actuator 34 to introduce small but variable increments of motion (of the order of 60 microns) in the image, between pulse bursts from the laser 12. Because these bursts occur at 150–200 times per second and are of very short duration, and because the corner mirror 24 need only be moved through a very slight angle, adequate spatial randomization of light from the different originating sources is readily achieved to the extent needed and within the intervals available.

In an alternative example, the relative motion between the quasi-random phase surfaces 19, 27 can be produced by forming the first surface 19 as part of a rotating disk, and varying the speed of rotation slightly to vary the degree of randomness achieved.

The imaging relay lens 26 and second field lens 29 also image the reticle masking assembly 22 in a 1:1 relationship onto a photomask 40 disposed at a photomask plane 42. The beam at this plane is in this example apertured by the reticle masking assembly 22 to a rectangular shape which is selectable in continuous fashion from 1½" to 4½" on a side, with adequately close tolerances (±0.005").

The significance of the spatial coherence randomizer 18 may be more definitively understood in terms of the increase which it provides in the average La Grange product of the beam. The laser beam from the excimer laser 12 has a limited La Grange product, of about $1.8 \times 10^{-7}$ cm$^2$ $^{Ster}$. This represents a number of sources in a narrowed excimer laser beam in a typical (approximately 0.3 sec) exposure. It can be shown that there are of the order of $22 \times 5.4 = 122$ statistically incoherent spatial modes emerging from the laser at any one instant. Also, there are about 20 wavetrains per pulse, 150 pulses per 0.3 sec. Thus, the laser supplies $1.22 \times 10^2 \times 2 \times 10 \times 1.5 \times 10^2 = 3.66 \times 10^5$ statistically independent sources per exposure. In order, however, for the sources to illuminate the image with spatial incoherence of desired degree, each point on the image must be illuminated by approximately $10^2$ sources of light. The total number of sources, derived from an approximately 4,000 line per millimeter resolution at the image size of the wafer plane, that are required are about:

$$10^5 \times 10^5 / (1.75)^2 \times 10^2 = 3.27 \times 10^{11}$$

This is the total number of statistically independent sources needed per exposure. The laser beam thus falls short by a factor of about $5 \times 10^4$ of the diversity required to give an image that is evenly but spatially incoherently illuminated. The La Grange product of the beam passing through the photomask and within the cone of acceptance of the imaging lens must be about:

$$2.56 \times 10^{-2} \text{ cm}^2 \text{ }^{Ster}$$

Each of the first and second quasi-random phase surfaces 19, 27 scatters the angular divergence by about $2.2 \times 10^2$, without substantially affecting the height of the principal ray over the size of the image. This combines to an overall increase of $5 \times 10^4$, which is that desired for the system. The La Grange product is accordingly adjustable by a factor up to $5 \times 10^4$. This adjustment can be made automatically, but in order to maintain the value within chosen limits, it is typically sufficient for an operator to preset, for a particular image size and exposure characteristic, the actuator control 38 in accordance with readings taken from the partial coherence modulus measuring device 36. The range of adjustments of spatial coherence length can be varied from approximately 1.5 microns, representing substantially incoherent light, to approximately 15 microns at the photomask 40.

In consequence, wave energy is distributed over a 4"×4" mask plane with even intensity to ±1% measured at the wafer plane, and adjustable in amplitude within ±1%. The total energy delivered in an exposure time of 0.3 sec. from the given excimer will be greater than 150 mJ/cm$^2$ at the wafer.

Randomization of spatial coherence to the desired degree, however, cannot affect the needed temporal coherence or periodic predictability of each wavelet in this statistically diverse multiplicity of sources. The phase retardations subsequently introduced in the composite wavefront by the phase plate vary throughout the beam distribution and the possible amount of retardation is substantial. Temporal coherence must thus be maintained so that it is orders of magnitude greater than the possible retardation for the wavefront to be precisely reconstituted. Also, there are many incremental variations (as much as 100 waves) in phase delay in this example. The time coherence which is required for proper operation of these phase adjustments is approximately 50 times the maximum number of waves of retardation which are designed into the system. Although the etalon tuned laser gives about 124,000 waves in a coherent wavetrain, which is about 25 times as many as required for the phase adjusting means, this factor works against providing the largest possible number of time independent sources. These can be established by reducing the temporal coherence to about 5,000 waves, but this in turn creates problems with the chromatism in lens design. Accordingly, it is preferred to maintain this factor between 10,000 and about 100,000, the former value being assumed in the present example.

The amount of light incident on the wafer plane in any one exposure can be selectively determined by a laser exposure control 44 which integrates the energy derived during successive bursts of the laser and terminates the exposure when adequate energy has been delivered. An alignment system 46, described below, is separately operated along the optical axis to direct an annular beam of different wavelength (typically red or blue) than the ultraviolet through the beam combining mirror 28 and various optical elements, as described below in conjunction with FIG. 7.

Between the photomask plane 42 and a wafer plane 50 on which a resist coated wafer 52 is precisely positioned by the XY axis drive system of a wafer stepper mechanism 54, shown only generally, is disposed an integrated optical system 56. The optical system 56 comprises a combination of refractive elements and a holographic wavefront adjusting means embodying a number of features in accordance with the invention. In the arrangement illustrated the system comprises one set of three refractive lens elements forming a collimating lens group 58, a multi-plateau phase plate 60 disposed at the aperture stop of the lens system, and an objective lens group 62 of four lenses projecting an image reduced by 5X toward the wafer plane 50. The interrelationships between the lens groups 58, 62 and the multi-plateau phase plate 60 are designed both to simplify the refractive lens design, as well as reducing the number of refractive elements, and to achieve higher order effects in wavefront adjustment that contribute not only to resolution, but also to depth of field, contrast and efficiency.

The lens assembly comprises spherical quartz elements while the phase plate 60 comprises a wavelet phase delay and redirection system that areally adjusts components of the image to define new composite wavefronts. The integrated optical system 56 is telecentric at the image plane, and the radiation bundle at the phase plate 60 and aperture stop is not exactly parallel but is slightly divergent. The quartz elements are designed so that all aberration components of any significance except the spherical aberration polynomial are cancelled by the spherical elements by utilizing the degrees of freedom accorded by their radii, their positions, their vertex thicknesses and their separations, and taking into account the radially varying phase lag introduced at the critical aperture by the phase plate. Spherical aberration, however, is limited to approximately 75 waves of optical path difference which is entirely corrected by the radially varying phase lag of the phase plate. Three of the elements on the objective side of the phase plate 60 are designed as a nearly aplanatic group and the fourth, the minus miniscus closest to the image plane, is largely used for its field flattening properties. The three lenses in the collimating group 58 cumulatively and in combination with the phase late are substantially responsible for eliminating coma and astigmatic aberrations of the system. The spherical quartz lenses, moreover, have a negative chromatic dispersion, and a feature of the present invention is that the transmission grating represented by the phase plate 60 produces the bending effect of a base power curvature that is slightly positive. This curvature is selected so that chromatic dispersion of the grating over the small laser bandwidth opposes but substantially matches that of the spherical quartz lenses to produce a nearly achromatic condition. This base spherical power cannot be depicted in the drawings because of the very small scale factors involved.

Wave energy from the illuminator 10 can be said to be substantially monochromatic, but any such source as the excimer laser 12 has a bandwidth or chromatic spread. If this bandwidth is extremely narrow, it reduces available light energy and increases problems with spatial coherence. The capability for achromatic operation provided by the present system enables broadening of the chromatic spread of the excimer laser 12 from 0.003 nm to 0.02 to 0.03 nm or more. Thus the illuminator must be substantially monochromatic but some chromatic spreading can be compensated, with the attendant system benefits that are derived.

Figure 2:
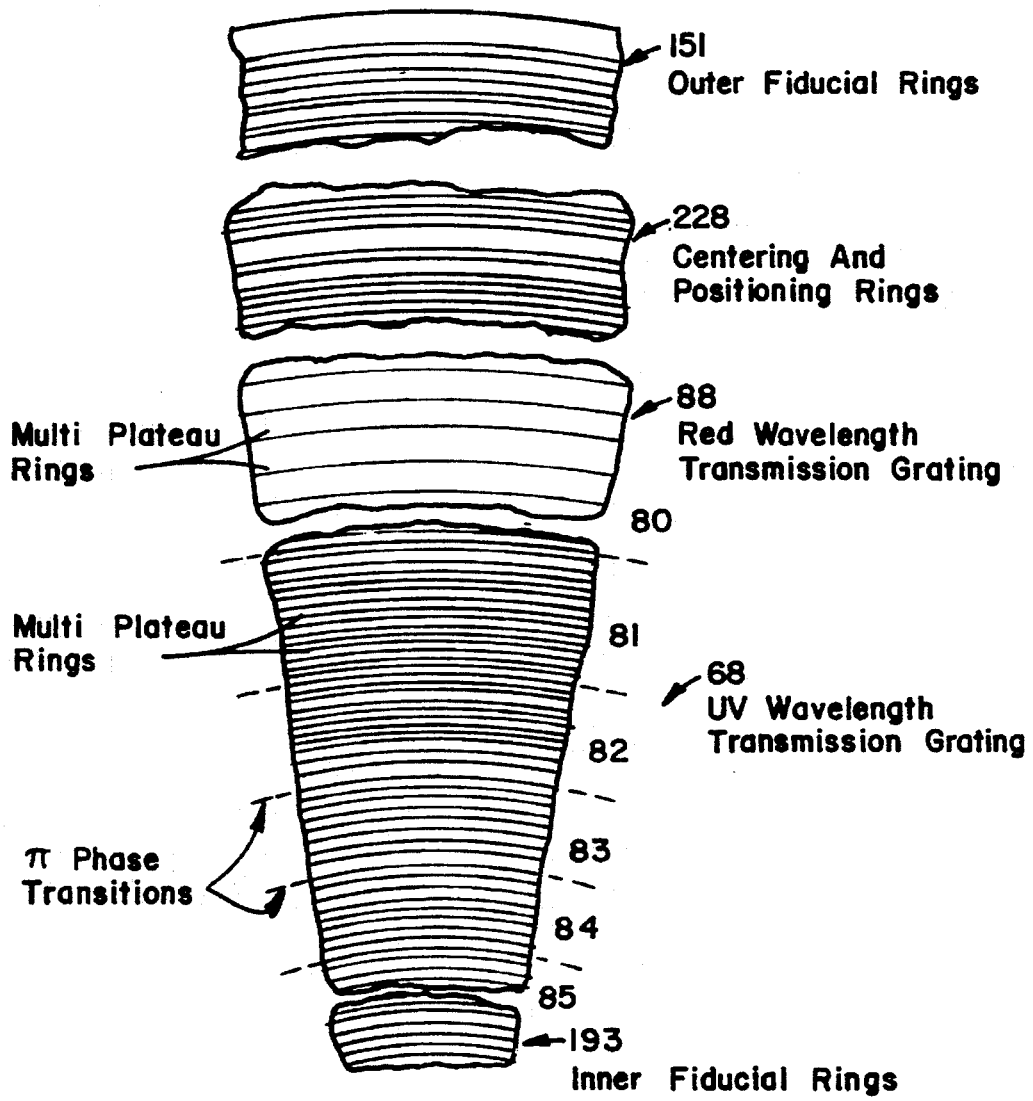
FIG. 2 is a front view of a portion of a phase plate that may be utilized in the system of FIG. 1, showing the general ring dispositions thereon in somewhat idealized form.

A region adjacent to the central area of the phase plate 60, and starting just outside of a set of inner fiducial rings described below referring now to FIGS. 2–4, comprises a microlithographically contoured surface of very low maximum height deposited on or etched into a phase plate substrate 64. The contoured surface is in the form of a plurality of rings 68 each comprising minute multiple plateaus or tracks 70 of deposited $SiO_2$ of precisely defined incremental heights. The typical ring 68 is of a radial dimension that is nonlinearly related to the radial position of the ring, and has eight plateau 70 levels, varying incrementally in steps of ⅛th wavelength optical retardation from zero height to a maximum of ⅞th wave height. The relationships are depicted schematically in the views of the phase plate of FIGS. 2–6. As seen in FIG. 4, in each ring 68, the plateaus 70 typically vary progressively from a zero height (relative to the substrate 64), through successive steps to the maximum ⅞th λheight. At 248 nanometers wavelength, the ⅛th high plateau is about 61.0 nm in height and the ⅞th high plateau is about 426.9 nm in height. The narrowest radial width of the rings 68 (at the outer edge of the phase plate 60) is of the order of 8 microns, so that each plateau is approximately 1 micron in radial dimension at a minimum. Because the radial dimension occupied by a ring 68 varies, the slope of the composite contour defined by the included plateaus 70 varies, with the steepest being shown here. This slope is just over 3.590 and the wavefront bending introduced is about 2°. Maximum wavefront bending is limited to about 5°, to achieve high efficiency transmission of light energy through this type of blazed grating. The differential height of the tracks on the plate is at a maximum proportioned to the ratio of one wavelength of incident monochromatic light, at the selected wavelength, divided by the index of refraction of the plate minus one.

There are approximately 200 rings 68 of eight plateaus each, but these are not in a regular progression. Instead, successive rings are arranged in six distinct groupings 80–85 in which the phases of the introduced phase delays are reversed. Successive groupings 80–85 are arranged to alternate in phase in 0, π, 0, π, 0, π fashion. The relative radii of these zones are, in this example, set as shown in the tabulation below:

| Radius of Zone Boundary | Phase |
|---|---|
| .99–.80 | 0 |
| .80–.65 | π |
| .65–.40 | 0 |
| .40–.30 | π |
| .30–.20 | 0 |
| .20–0 | π |

The interposition of the multi-plateau phase plate 60, with its finely divided rings 68 and minutely divided plateaus 70, adds incremental, wavelength related, lengths of optical path as a function of aperture radius in a spatially distributed manner across the wavefront. The differential thickness of the phase plate 60 is very small, not being more than ⅞ wave lengths of retardation or about 427 nm in this example. However, because the light source is substantially monochromatic, resolution is maintained by aligning the wavelets with respect to a phase reference. Therefore as see in FIG. 3, the effect is that of cumulative retardation of the composite wavefront formed by the illuminating monochromatic light. Where the refractive optics curves the composite wavefront, as seen in FIG. 4, the phase alignment is maintained as well. It should be noted, however, that the phase plate 60 precompensates for aberrations in subsequent refractive optics, and that such precompensation is not depicted in FIGS. 3 and 4.

The phase plate 60 more specifically functions both as a holographic element operating in a Bragg regime and as an asphere in cooperative fashion with the refractive elements. As a consequence of the aspheric characteristic, the residual spherical aberration that is permitted within the refractive optics design is compensated by needed fractional amounts throughout the entire wavefront, at the same time that the other geometrical aberrations and the chromatic aberration are also cancelled. Because the multiple point light sources directed at the aperture stop are redirected as individual wavelet components, the segments 80–85 of the phase plate 60 also redistribute light within the image plane in a unique manner. The separate phase reversal 3 within the phase plate 60 define multiple pupils within the system which enable coactive imaging with a substantial number of beneficial effects.

It will be understood by those skilled in the art that the number of plateaus used may be varied from the eight given in the present example. Using 16 plateaus varying by $\lambda/16$ in a regular progression increases fabrication times and problems, but enables the blaze angle to be smoother and more efficient. These levels may be provided by a cumulative binary progression as described in the present example. In contrast, a lesser number of levels (e.g. four) can be utilized if the somewhat coarser and less efficient grating that results is acceptable for a given application.

Figure 6:
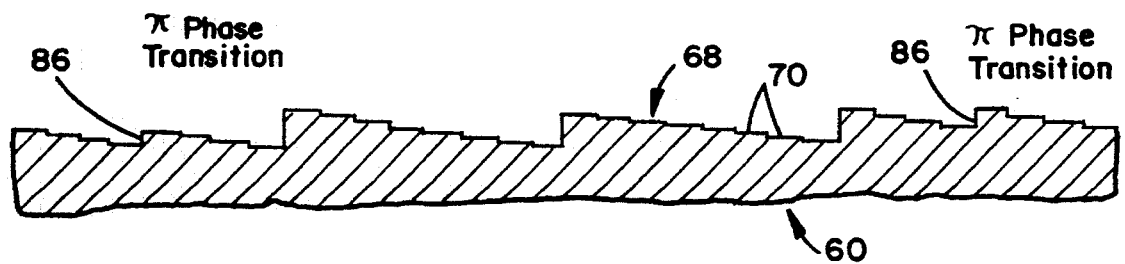
FIG. 6 is another fragmentary side sectional view of a phase plate showing the manner in which phase reversal is incorporated.

The primary features that are sought in this optical system design are increased resolution, reduced sideband intensity, and increased depth of field, and these are all enhanced by the usage of the ring 68 groupings which define multiple pupils. As seen in FIGS. 5 and 6, where a $\pi$ phase reversal is desired the regular progression of plateaus 70 is interrupted at an out of phase step 86. The plateaus 70 thereafter change progressively in the zero to seventh sequence until the next interruption. When the beam components from the separate pupils recombine to form the composite waveform, thereafter, the minute displacements in images from the separate pupils enable enhancement of any or a number of the factors noted. $\pi$ phase reversal into two, three and four radially different groupings have been found beneficial for certain specific applications, although it will be recognized that many such zone combinations can be chosen to emphasize resolution, depth of field or contrast. The six groupsing 80–85 shown are preferred for the wafer stepper application because these multiple pupils increase depth of field while preserving image contrast, factors which are of significant importance in the semiconductor fabrication process. In addition, improvement in resolution beyond the unobstructed Airy lens is also realized.

Redistribution of wavelets in the beam transmitted through the phase plate 60 can also be accompanied by the use of fully opaque or only partially transmissive annular rings or ring groupings. The opaque rings can be placed wherever lens system design analysis indicates that it is desirable to cancel or reduce beam components that limit performance.

In terms of optical design, systems in accordance with the present invention offer substantially greater design freedom in balancing of aberrations. As discussed in Hopkins, *Wave Theory of Aberrations*, Clarendon Press, 1950 at p. 50, optical path difference can be analyzed as a polynomial in which the difference is taken between any set of rays starting at a point, h, on an object and going through different points at a radius of $\rho$ and at a meridianal angle $\phi$, compared with the optical path of the principal ray from h, at $\rho=0$, in the pupil or critical aperture. After expansion the individual terms of the polynomial can be conveniently grouped into terms containing $\rho$ alone (a series expressing the spherical aberration of the system), other terms containing $\rho$ and h only (which can be regarded as "spherical-type aberrations"), and those terms containing h, $\rho$, $\cos\phi$) to some power. The terms containing $\rho$ and h only relate to field curvature aberrations, while those containing h, $\rho$ and $\cos\phi$ include comatic and astigmatic type aberrations.

Located at the aperture stop the phase plate adds an optical path delay to every ray which is a predetermined function depending upon the radius an the angle at which the ray passes through the plane of the critical aperture. Since spherical aberration is an axial aberration depending on radius alone the proper amount of phase delay introduced at the right height in the aperture stop can completely correct all orders of spherical aberration.

All the spherical-type aberration terms in the expansion of the polynomial are treated symmetrically by the phase plate. The task of the lens designer is to choose the refractive elements of the system so that the remaining comatic type terms and astigmatic type terms are reduced to the point where they balance each other and where their residual balances the radially varying delay introduced by the phase plate.

Those skilled in the art will realize that while this aberration balancing will normally take place within a sophisticated lens computer program, it nevertheless requires that the collection of terms containing each component power of $\cos\phi$ be separately balanced to zero or close to zero. The fact that the phase plate potentially eliminates all orders of spherical aberration makes the rest of the design proceed very much easier and makes a solution possible with considerably fewer elements.

In summary, this system operates by using redistribution of the microstructure of a time-varying sequence of waves which have predictable periodicity but spatial randomness. Using successive light bursts from an excimer laser, uniformly distributed light appears to the holographic phase plate element, over the interval of a total exposure, as a multiplicity of sources. At the phase plate 60, the phase adjustments made in beam wavelets are achieved while also maintaining high efficiency transmission. The system provides precision to better than $1/10$th wave throughout the composite wavefront. The system enables reduction of the number of spherical quartz lens elements in comparison to what has previously been used while overcoming the presently existing barriers on line resolution. The limited bandwidth of the illuminating beam together with the properties of the phase plate enable both spherical aberration and chromatism to be closely compensated.

Other wave energy sources than lasers can be used if they have the needed properties. The individual lines of some mercury arc sources, for example, easily meet this criterion. This can be seen from an article by Kevin Burns and Kenneth B. Adams published in the *Journal of the Optical Society of America*, Vol. 42, No. 10, October 1952, pages 717–718 and entitled "Energy Levels and Wavelengths of the Isotopes of Mercury −199 and −200". Table 1*a* in that article, which shows line resolution for certain lines of Hg 199, demonstrates the needed temporal coherence. These lines together make up the 256 nm band of the lamp emission. By solving the problems of achromatism (figured over the entire band) by conventional methods, then each of these line components represents a source of sufficient temporal coherence to be used.

As another example, Table 1*b* of the article shows the detail of the 365 nm band of Hg 199. Here the achromatism problems have been solved by conventional methods, so that the phase plate can be designed to function as a conventional but very versatile low power aspheric lens. Its use in such a design results in a reduction in the number of glass elements necessary, as well as in improved performance. The phase plate is computed as a Bragg grating, with a central wavelength of highest efficiency. However, by inspection of Tables 1*a* and 1*b*, one can see that the total overall spread from top to bottom of a given Hg emission band is less than 2 parts in 1000. Thus tuning is a relatively minor consideration.

Applied to the design of lenses in more conventional wavelength regions, for example 365 nm, 404 nm or 438 nm where sources of high temporal coherence can be obtained, phase plate technology results in considerable simplification, since higher order aspherics can be prescribed and precisely constructed not only to the design requirements, but to compensate for the small but real departures from ideal of the spherical elements themselves.

Referring again to FIGS. 2 and 5, the phase plate 60 includes, outside the blazed transmission grating area defined by the rings 68, a plurality of separate concentric transmissive multi-plateau rings 88. These rings 88 are also of $SiO_2$ and formed by deposition or by etching of the surface of the substrate defining the phase lens 60. The ring 88 widths and slopes are selected relative to a longer, red, wavelength that is to be used for alignment of the wafer 52 on which the image defined by the photomask 40 is to be formed. Thus the widths and slopes are greater than those of the rings 68 used for the ultraviolet range, but eight increments of height are still used. The same process of binary accumulation or etching of layers is used, but because greater thicknesses are employed the rings 88 must usually be formed separately from the rings 68.

The purpose of these rings 88 is to concurrently provide, in conjunction with the optical system sets 58, 62, a focused beam on the wafer 52 so that signals can be generated indicating the precise position of the wafer 52 relative to the photomask 40, which has fiducial reference marks on it. Fiducial marks on the wafer 52 alone can also be sensed.

Figure 7:
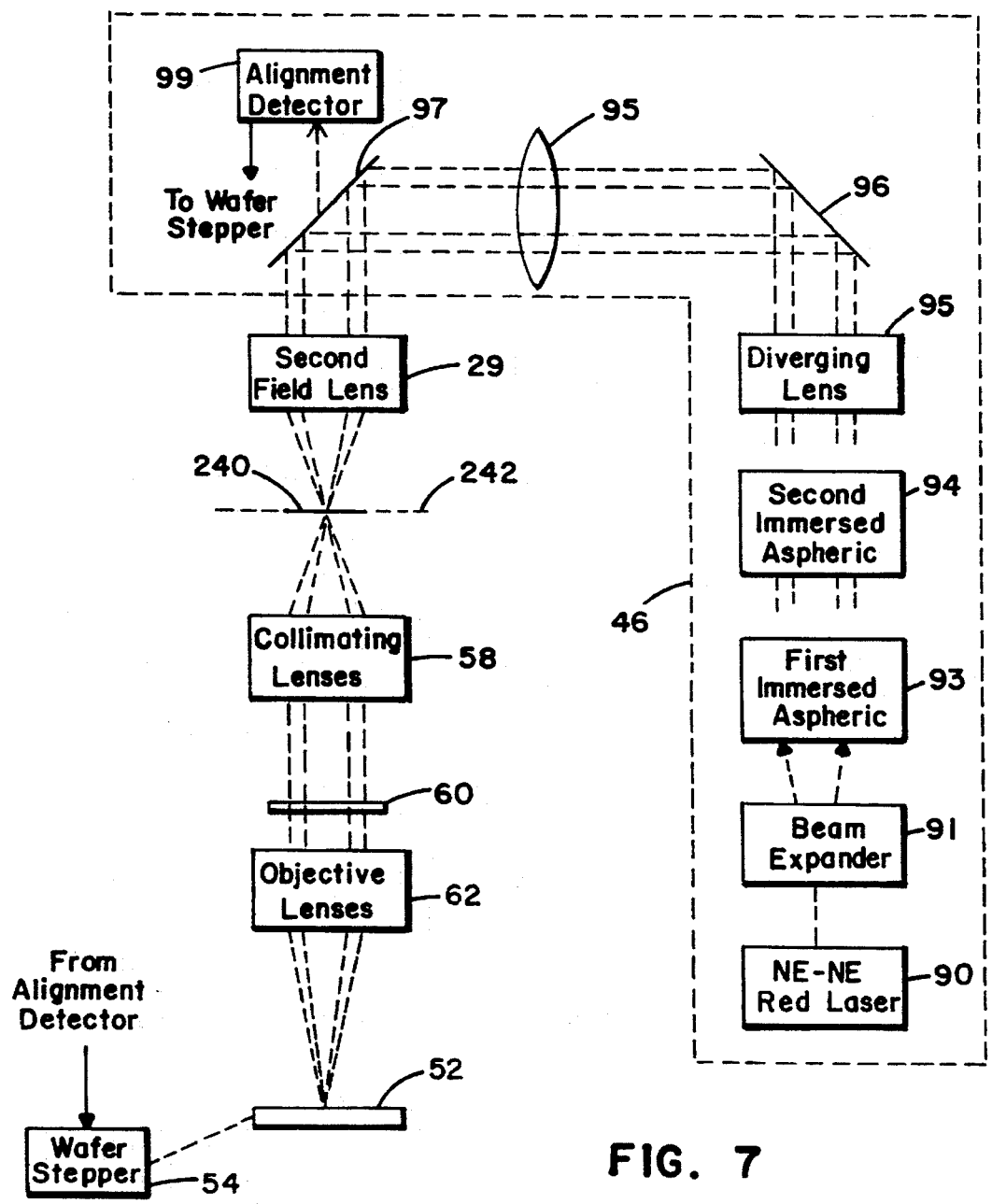
FIG. 7 is a block and schematic diagram showing further details of a wafer alignment system for use in the system of FIG. 1.

The red wavelength does not affect the photoresist layer on the wafer 52, so that it may be used concurrently with the ultraviolet illumination. Referring now to FIG. 7, there is shown an alignment system 46 for providing a finely focused reference beam on the wafer 52 for alignment purposes. The system utilizes an He-Ne laser 90 here having a monochromatic wavelength of 633 nm, which is in the red portion of the spectrum. The laser 90 generates a narrow output beam having a Gaussian distribution that is spread into a wider pattern by a beam expander 91. This expanded beam is converted into an annular pattern by first and second immersed aspherics 93, 94 respectively, the first of which creates a ring distribution, forming the light into converging beams focusing on a ring of given radius, while the second immersed aspheric 94 substantially collimates the beams to form the annular pupil pattern. The annular pupil pattern is reflected off a first corner reflector 96 and a second corner reflector 97, which is of the dichroic reflecting type, into the optical path of the ultraviolet beam in the system of FIG. 1. The annular beam is focussed by the second field lens 29 in conjunction with the lenses 95 onto the photomask plane 42, illuminating the area of a fiducial pattern on the photomask 40. The beam then enters the optical system 56 to be reimaged as an annular pupil covering the area of the multi-plateau rings 88 on the phase plate 60, and caused by the lens sets 58, 62 to be focused and reimaged on the wafer 52 and reflected back through the optical path. The reflected red light fiducial pattern is reflected back through the dichroic corner mirror 97 to the alignment detector 99, which matches the direct and reflected fiducial images to produce an alignment signal which controls the wafer stepper 54 to position the wafer 52 in known fashion with the order of accuracy required.

Thus the system of FIGS. 1–7 incorporates integrally a non-interfering alignment system that enables the precise adjustment needed to be made in the wafer position. Because the outer rings 88 can be laid down with reference to the same central axis as the ultraviolet concentric rings 68 there is assured concentricity.

Figure 8:
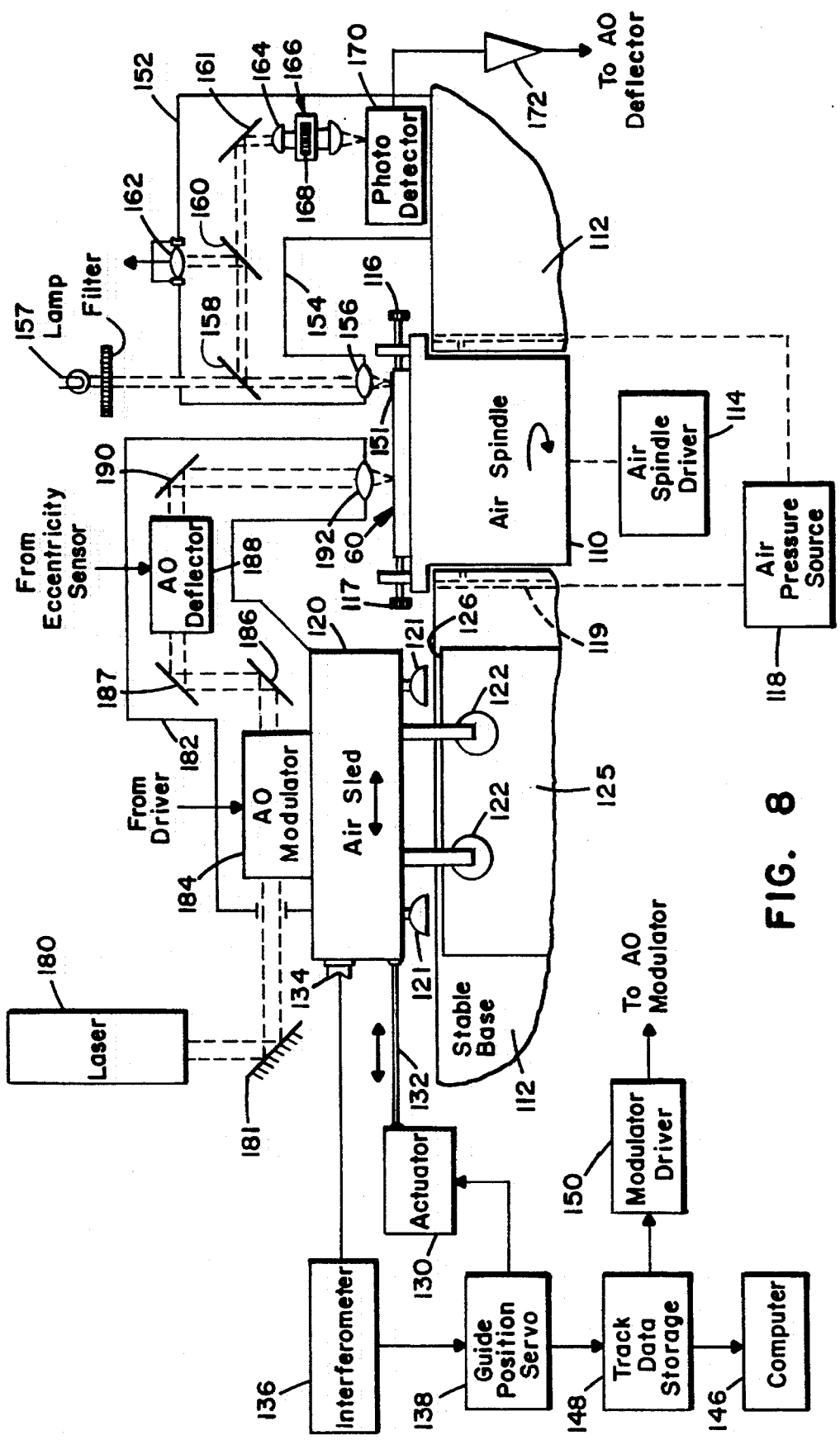
FIG. 8 is a sectional and block diagram view showing a direct write system for making a phase plate in accordance with the invention.

The principal elements of a direct write system for defining the precisely located concentric tracks on the phase plate 60 are shown in FIG. 8, to which reference is now made. Here the phase plate 60 is mounted on a high precision air spindle 110 which spins on air bearing supports in a concavity 111 in a stable, e.g. granite, base 112. An air spindle driver 114, which may be a magnetic or pneumatic device, is coupled to rotate the air spindle 110 at a selected rate, such as 25 rps. A phase plate 60 placed on the top surface of the air spindle 110 is positionable with a substantial but not fully exact degree of accuracy along orthogonal X and Y axes by precision adjustment screws 116 extending through posts 117 at the periphery of the air spindle 110. An air pressure source 118 provides pressurized air through conduits 119 in the base 112 to maintain both vertical positioning and horizontal centering of the central axis of the air spindle 110 on the air sled 120. As can be seen, however, no central shaft or other mechanism is utilized for locating the phase plate 60 relative to a central axis. An air sled 120 adjacent the top portion of the air spindle 110 is laterally movable relative to the spindle 110 on air bearing foot pads 121 that protrude below the air sled 120 and air bearing side pads 122 that extend horizontally. The foot pads 121 support the air sled 120 in floating relation above the top reference surface of the granite base 112, while the side pads 122 maintain a fixed small separation from a vertical side reference wall 125 on a vertical extension 126 of the granite base 112 (or a separate member in fixed relation to the base 112). Means for mechanically biasing the air sled 120 in the direction toward the vertical reference surface on the block 126 are not shown, but may comprise a pneumatic source or a servo mechanism. This air bearing support at the side thus maintains a precise separation from the side wall 125 although the air sled 120 may be moved in a direction parallel to the wall 125 and radially relative to the phase plate 60. Internal conduits for pressurizing the air bearings are not shown in detail.

The air sled 120 is positionable in the direction parallel to the vertical reference surface of the block 126 by an actuator 130 coupled to a bar 132 of rigid, stainless steel, construction that is coupled to the air sled 120. Movement of the bar 132 by the actuator 130 along this axis changes the radial position of the phase plate 60 and a writing beam from a deflection system mounted on the air sled 120, as is described in greater detail below. For approximate positioning control of the phase plate 60, a retroreflector 134 on the air sled 120 bounces a laser beam back to an interferometer 136, which may be a Hewlett-Packard Model 5110. With this interferometer 136, and a guide position servo 138 to control the actuator 130, the position of the air sled 120 and air spindle 110 may be maintained to well within 1 micron. Track positions on the phase plate 60 are defined by a track data storage and sequencing system of the form of a master track writing system for magnetic or optical data disks, including a computer 146 and data storage 148. The storage 148 contains the necessary information as to precise track positions, track widths and track pattern modulation. Under control of the computer 146, track pattern modulation signals are sent from the data storage 148 through a modulator driver 150 to a writing beam control as is described in greater detail below.

It can be seen from the description thus far that the air sled 120 is positioned approximately with considerable precision in each of two orthogonal directions, one of these positions being variable under control of the actuator 130 to select different tracks on the phase plate 60. The air spindle 110 itself is air centered around its nominal axis within the concavity 111, and the phase plate 60 is secured at some approximate centration on the air spindle 110 by the peripheral position screws 116.

For final precise, dynamic, positioning the system deflects the laser beam relative to fiducial rings 151 that are located at the outer periphery of the phase plate 60. These rings 151 may be of chrome or other opaque material and predefined on the phase plate 60 by a deposition or etching process using precision rings on a photomask. However they may also be separately defined by a direct write sequence on the surface of the periphery of the phase plate 60 when it is first centered on the air spindle 110. This procedure is employed in the present example. Approximately twenty of these rings 151 are incorporated of specified widths and spacings varying from 1.5 to 4.0 microns by rotating the plate 60 about its arbitrarily centered position and defining the annuli by photolighographic or precision cutting techniques. The rings 151 then are used as centration references for each subsequent repositioning of the phase plate 60 during manual adjustment and subsequently for dynamic control of the writing laser beam to account for minute eccentricities. Thereby a precision is achieved which cannot generally be achieved by mechanical means.

A viewing and sensing system mounted on the granite base 112 and is used for both initial and dynamic adjustments. A column 152 includes an air 154 overhanging a fixed position of the phase plate 60 opposite the fiducial rings 151. A conventional red light source and a voice coil actuator system for automatic focus are not shown in the interests of simplicity but will often be employed. A lens 156 adjacent the phase plate 60 reflects the image of a light source 157 off a beam splitting mirror 158 through a second beam splitter 160 to an eyepiece 162. The light source 157 is at a different wavelength than that to which photoresist material on the plate 60 is sensitive. An operator may view, through the eyepiece 162, the relative position of the fiducial rings 151 and adjust the positioning screws 116 to achieve approximate concentricity (e.g. to approximately 1 micron) of the phase plate 60 on the air spindle 110.

During writing operations thereafter a display of a number (e.g. 20) of the fiducial rings 151 is imaged off directed through the beam splitter 160 to a mirror 161 and through a lens 164 onto a reticle 166. The reticle 166 has a pattern of opaque lines 168 which corresponds to the specified widths and spacings of the fiducial rings 151 on which fall the image of the reflected rings from the phase plate 60. A maximum signal is provided when the blank spaces between the reflecting fiducial rings 151 on the phase plate 60 are precisely in line with the opaque strips 168 on the reticle 166 and a minimum signal results when the reflected image of the rings 151 falls on the transmissive line portions on the reticle 166. If there is any eccentricity in the pattern a photodetector 170 behind the reticle 166 provides a signal through a preamplifier 172 that varies in sinusoidal fashion with the eccentricity variation. The periodicity of this sinusoidal variation is relatively long term, being determined by the rotational rate. Alternatively, a reticle 166 may be used which contains fewer or more lines within a given angle than that subtended by the image of the fiducial rings. This creates a pattern which cross-correlates with the fiducial ring pattern in a predetermined manner, and an alternating signal is generated, the amplitude of which is related to the decentering displacement.

This eccentricity variation is utilized to radially position a writing beam directed against the phase plate 60 so as to maintain concentricity within 0.1 micron. To this end, a laser 180 is affixed to the stable granite reference base 112 and the laser beam is directed off a fixed reflector 181 into a housing 182 mounted on the air sled 120. The beam is deflected off the reflector 181 through an acousto-optic modulator 184. The laser 180 is chosen to be of a wavelength to effectively expose the photoresist and develop a fixed image upon it. The beam after modulation is directed off a pair of reflectors 187, 187 to other corner mirrors 186, 186 through an acousto-optic deflector 188 in a lateral arm 189 of the housing 182 before being deflected down off a mirror 190 and through a lens 192 to focus onto the subjacent area of the phase plate 60. Again a conventional autofocus system may be utilized but is not shown. The acousto-optic modulator 184 receives modulation signals from the modulator driver 150, while the acousto-optic deflector 188 receives control signals from the eccentricity sensor circuits 170, 172. The deflector 188 varies the radial position of the laser beam impinging on the track, relative to its nominal position as determined by air sled 120 location, so as to cancel out residual eccentricity, in response to the signal from the photodetector.

Particular consideration must be given to machine calibration when it is desired to achieve positioning accuracy such that sub-micron resolutions are achieved in placing the plateaus relative to the optical system. To calibrate the machine, the phase plate 60 itself is used as a reference. In addition to the outer reflective fiducial rings 151, a second set of rings 193 is written, by photolighographic techniques or scribing on a chrome surface, much closer to the center of the phase plate 60. These rings 193 are shown generally in FIGS. 2 and 5. Both the outer and inner fiducial rings 151 and 193, respectively, are written concentrically relative to the initial center of rotation, which is determined within certain arbitrary limits by positioning of the phase plate 60 on the rotating air spindle 110, but which is not more precisely known at that time. To locate the positions of the rings precisely for calibration purposes the system of FIG. 8 including the interferometer 136 and computer 146 can be advantageously employed, although the sequence of measurements and calculations can also be carried out by an operator. The air sled 120 is moved through a span of radial positions with the laser 180 beam on and a sensor (not shown) in FIG. 8 detecting the reflected signal. This detector provides a signal variation during passage of the focused beam past each ring, and each such pulse is used as a trigger signal. Interferometer 136 readings are concurrently taken and correlated in a data processor with the trigger signals. As each ring, first in the outer set 151, is detected in this manner, the fringe count from the interferometer 136 is entered in the computer 146 as a precise indication of radial position. The radial scan is carried through the inner ring set 193, on both sides of center, with a reading being triggered as each separate ring passes the reference point. By using the computer 146 to perform a linear regression precise averages can be computed and the center of rotation can then be determined with great accuracy. The radial distance of the outer ring set 151 can also be determined against this calculated center, using the interferometer 136 measurements. The calculations enable precise calibrations to be made for the then existing temperature, pressure and velocity of light conditions. Standards are established for comparison against later calibrations, and small but meaningful compensations can be calculated for all meaningful variations. Thus when the multi-plateaus are radially positioned using interferometer measurements accuracy can be maintained to ±⅒ micron and phase retardation at the different areas can be assured.

In operation, therefore, the nominally centered air spindle 110 and phase plate 60 need not be initially precisely located against a selected reference to the high order of precision needed for writing successive tracks on the phase plate 60. Instead, after a photoresist material is applied to the intermediate area of the phase plate 60 for start of the microlithographic sequence, the operator may first approximately position the plate 60 using the positioning screws 116, based upon viewing of the fiducial rings 151. With the air spindle 110 rotating, any eccentricity relative to the fiducial rings 151 results in generation of a long term sinusoidal eccentricity signal and dynamic correction of eccentricity by the deflector 188. It will be understood that the inverse arrangement can also be employed, with the eccentricity sensor on the air sled and the laser beam fixed. However, the configuration shown provides better stability for the air spindle 110.

The spindle drive servo loop may drive to incremental positions which are slightly different from the ring radial position which is desired. However ,this difference is also compensated for as a component of the beam correction added in through the acousto-optic deflector.

Both the outer and inner fiducial rings may be advantageously placed by arranging their ring-to-ring spacings and widths in a non-regular manner. Schemes for spacing the rings in the fiducial sets may vary from purely regular to pseudo-random, random or functionally disposed, as for example according to a mathematical series.

Thus identification of each ring, in a multiple ring set is made possible through knowledge of spacing characteristics, and ambiguities which might occur if one ring is mistaken for another are avoided. A further advantage from such non-regular ring spacing is that the characteristic error signal derived from the photodetector in the eccentricity sensor system described below can be shaped to contain neither ambiguities nor phase reversal in its error curve.

A typical direct writing sequence on a phase plate 60 commences after initial surface preparation of the phase plate 60 and incorporation of the outer fiducial chrome rings 151, either by a separate photolighographic sequence or by cutting when on the air spindle 110. The phase plate 60 can be taken off the retainer system on the air spindle 110 at any time to apply a layer of photoresist to the desired depth. This layer is placed over the entire area, including the fiducial rings 151 within which area the multiple level plateaus are to be formed. Since photoresist is substantially transparent to red light, the fiducials can be seen by the eccentricity detector.

Next, the phase plate 60 is repositioned on the air spindle 110, the operator first making manual adjustments while observing through the eyepiece 162, until approximate concentricity is obtained. Then the air spindle 110 is rotated at the selected rate and, with the laser focused on a selected track position, a predetermined width of track is written. Following each writing of a track, the air sled 120 is repositioned by the actuator 130 under command of the computer 146 to a different radial track location. Other tracks are successively written until a complete exposure has been made for all the tracks that are to have that plateau level after the following deposition or etching step.

An alternative procedure is to drive the air sled 120 at a steady rate of 0.1 microns pitch per spindle rotation. The spiral pattern thus created is effectively indistinguishable from a circular pattern created by an intermittent drive.

The phase plate 60 is then removed from the location on the air spindle 110, the photo-exposed image is fixed and undeveloped material is removed to leave the predetermined image. Deposition or etching is then undertaken to the desired level, and the fixed resist layer is completely removed so that a new resist layer may be laid down in turn for writing the pattern for the next group of tracks. The sequence is then repeated, exposing the photoresist, washing out the unfixed material, depositing or etching to the next plateau, and again removing the fixed photoresist so that the cycle can again be repeated if desired.

By this method of directly writing on a high precision, concentric track phase plate it is possible to avoid the manufacture and placement of a separate mask for each level of plateau to be deposited or etched. This is particularly important for ultra-high resolution systems, wherein the phase plate can be individualized by computation to give the best correction for the actual characteristics of the finished lens assembly components. For this purpose the lens components are first designed, ground and polished to the closest approximation of the specified ideal characteristics. Then the components can be analyzed for the degree and sense of the variation from ideal, and corrections tailored to the actual characteristics can be computed. This information is computed and placed in the track data storage 148, which may be a disk file, tape transport or other memory system. The contents of the track data storage 148 can further be modified in accordance with the calibrated values. Such custom adjustments enable resolution to be maximized for each individual system.

Figure 9:
FIG. 9, comprising separate segments 9A to 9F, is a representation of separate steps that may be used in forming a phase plate by deposition.
Figure 10:
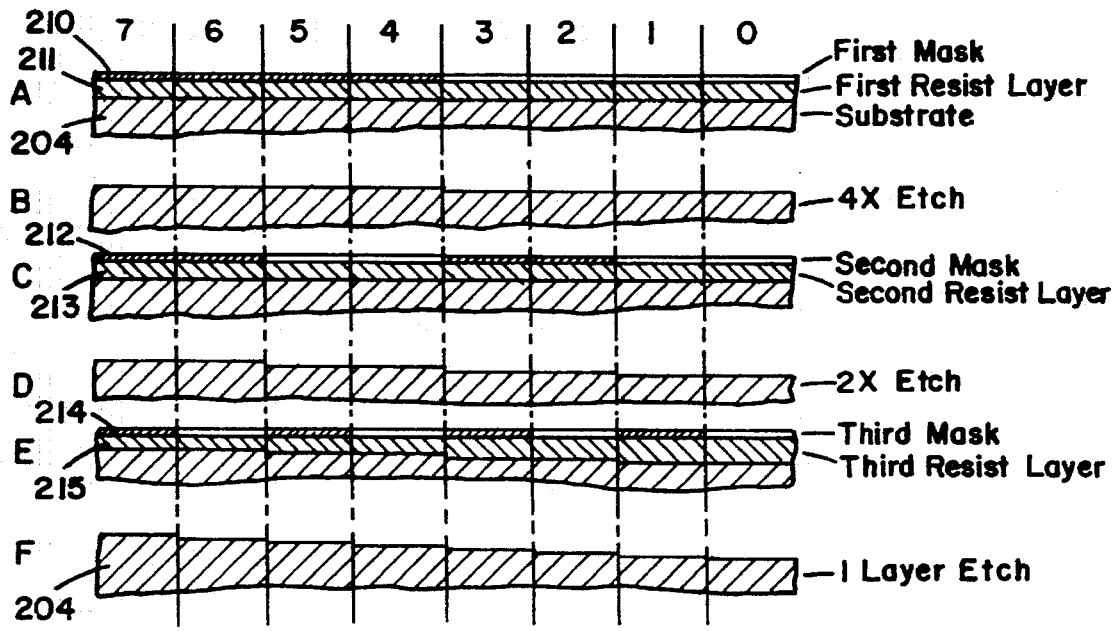
FIG. 10, comprising separate segments 10A to 10F, is a representation of separate steps that may be used in forming a phase plate by etching.

This advantageous method does not preclude the use of individual masks for deposition or etching, which methods are shown in FIGS. 9 and 10 respectively. Both Figures show how a regular succession of eight plateaus of selected height (exaggerated in FIGS. 9 and 10 for clarity but typically no more than 427 nm for a UV wavelength) are formed by a sequence of steps. The plateau positions are designed from zero to seven, ranging from the lowest plateau to the highest and some of the steps are combined for brevity.

Referring first to FIG. 9, a first mask 200 is prepared and, using a contact print frame of conventional design, placed in contact on top of a first resist layer 202 which has been placed on the substrate surface 204. To achieve eight different layers with only three deposition steps, the deposition is carried out in binary fashion with layers that vary in thickness by multiples of the smallest increment of a wavelength. The resist used may be a positive or negative resist in that after an exposure is made through the first mask 200 either the exposed or the unexposed area may be washed away. Similarly the image on the mask may be positive or negative. In this instance the negative resist material is used, and the photoresist that receives the light is not fixed and can be washed off, while that which is not exposed becomes fixed. After washing the pattern of protected material on the substrate corresponds to the opaque designated areas in the first mask 200 of FIG. 9A. Using a vapor deposition process and monitoring the thickness of vaporous silica as it collects on the substrate 204, a first plateau builds up at positions 1, 3, 5, and 7 as seen in FIG. 9B, the resist layer 202 having been washed away. Then a second resist layer 205 is deposited and covered with a second mask 206 which obscures positions 0, 1, 4, and 5 as shown in FIG. 9C. After the exposure of light through the mask 206, removal of the mask 206 and washing, as seen in FIG. 9D, a second plateau is deposited to add a thickness two times the first to all exposed areas. This procedure leaves the substrate as seen in FIG. 9D. It will be noted that there are two four-step sequences starting with the zero plane at positions 1 and 4. FIG. 9E shows the application of a third mask 207 on top of the third resist layer 208, to cover positions 0–3 so that the addition of a four-high layer after removal of the exposed photoresist leaves the regular progression of plateaus from 0–7 (FIG. 9F). In the placement of the successive masks 200, 206, 207 the fiducial rings on the outside of the phase plate are employed for precise location. It is also feasible to achieve the same result by reversing the order in which the masks are applied.

FIG. 10 depicts the sequence by which a progression of plateaus can be etched into the substrate. The clear areas of a mask designate those areas of the resist layer from which material is to be removed from the substrate. The same three-step sequence of layer formation is used, but the order of plateau formation is reversed, with the deepest etching taking place first. The first mask 210 (FIG. 10A) covers positions 4–7 over a first resist layer 211, so that a four-deep layer etch is then used to create a lower plateau at positions 0–3 (FIG. 10B). A second mask 212 over a second resist layer 213 blocks out positions 2, 3, 6, and 7, to leave the four two-high increments of FIG. 10D. Then a third mask 214 over a third resist layer 215 covers positions 1, 3, 5, and 7, so that the third single layer etch leaves the regular plateau progression of FIG. 10F.

Although the direct writing technique is preferred, for the given reasons, individual photomasks can also be generated utilizing the precision beam writing system of FIG. 9. The photosensitive material can be retained in a frame on the air spindle and held in position during writing of fiducial patterns and individual tracks.

Figure 11:
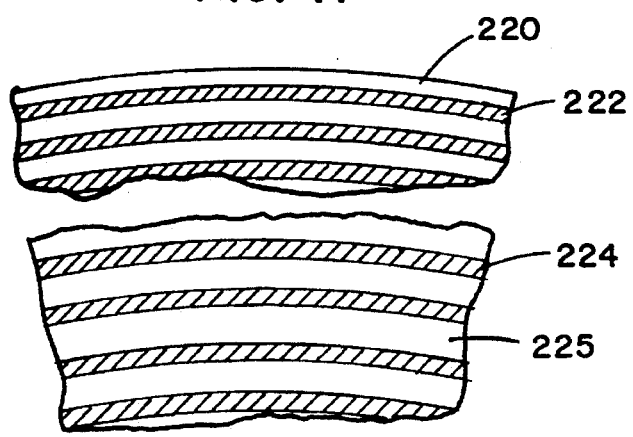
FIG. 11 is a plan view of a portion of a photomask that may be used in making a phase plate in accordance with the invention.

The fiducial rings 151, 193 can be laid down in the chrome during the first writing process. Because of the positional accuracy of the spindle 110 they are very closely circular, define the center of the ring pattern and are concentric with the central axis so that no eccentricity correction need be made. A fragment of a mask 220 for the outer fiducial rings 151 is shown in FIG. 11, greatly enlarged because the individual tracks are so small. Fiducial rings 222 are provided in the outer region, for alignment with the outer fiducial chrome rings 151 near the periphery of the phase plate, so as to insure centration of each individual mask 220. The tracks defining individual plateaus in the multi-plateau patterns are shown as opaque regions 224 and transmissive regions 225.

Figure 12A:
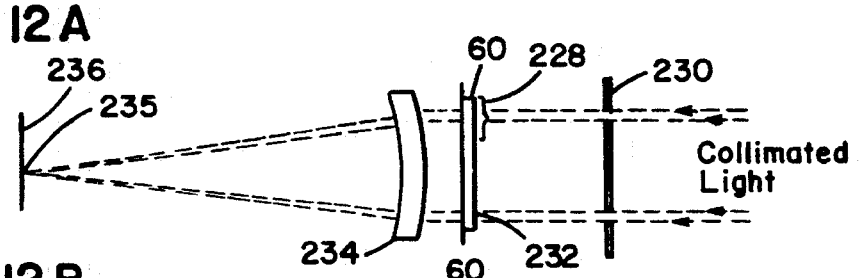
FIG. 12 depicts in FIGS. 12A to 12C separate steps that may be used in alignment of the lens elements in a system.
Figure 12B:
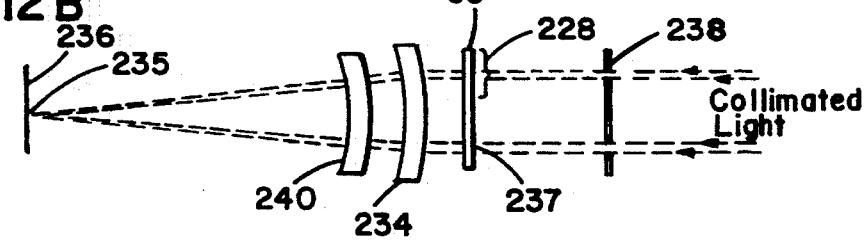

Precision centration and alignment of different lens elements in the system by conventional methods can require substantial expenditure of time and effort. To simplify this task, a number of sets of centering and positioning grating rings 228 (FIGS. 2 and 5) are also initially built into the chrome substrate near the outer portion of the phase plate 60. Thus these rings 228 are also automatically centered and at the critical aperture when the phase plate 60 is in position. A number of such grating ring bands are disposed between the outer fiducial rings 151 and the red wavelength transmission grating 88. Individual ones of the bands are used to substantial advantage in initial assembly and alignment procedures, as illustrated in FIG. 12, because they maintain the required precision, both in angle and in element spacing. The phase plate 60 is first placed at the critical aperture of the system so that all of the lens elements can then be positioned and centered relative to it. To this end, as seen in FIG. 12A, collimated light from a source (not shown) is preferentially shaped into a ring form by passing through an aperture plate 230 so as to fall on a first band of centering and positioning gratings 232 (a subset of the grating rings 228) on the phase plate 60. A first lens element 234 is then adjusted with respect to the center of the optical axis so that light focuses on the optical axis at a precise point 235, which point is thereafter established as an axial reference. A diaphragm 236 with a very small hole in it is placed at this position. This band 232 of the set of centering and positioning grating rings 228 is configured with knowledge of the actual characteristics of the first lens element 234, so as to focus for that particular element alone. A second band 237 of centering and positioning rings on the phase plate 60 is then illuminated through a second aperture plate 238 with the collimated light. Here the second band 237 is designed to bend light in accordance with the combined characteristics of the first lens element 234 and a second element 240. Again, the second element 240 is moved until focus is obtained at the selected point 235 on the optical axis.

Figure 12C:
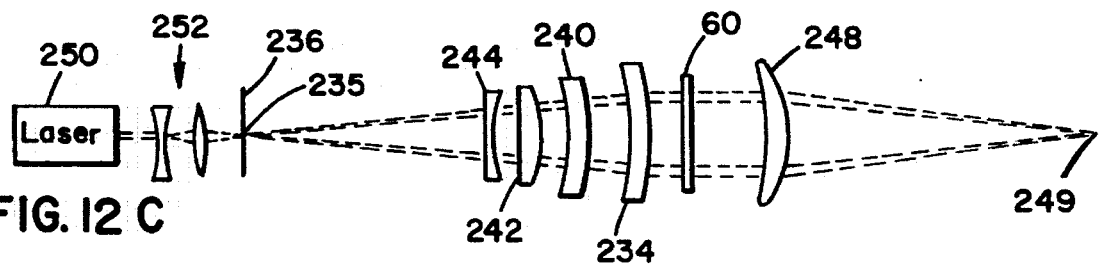

This sequence is repeated with different optical elements and grating ring bands until as seen in FIG. 12C all additional optical elements are installed on the same side of the critical aperture position of the phase plate 60. Then the hole in diaphragm 236 is illuminated from behind by a laser 250 and image reduction lens set 252. Thereafter, using a different set of bands 245 on the phase plate illuminated through the lens elements 234, 240, 242 and 244 via a shaped aperture plate 246, another lens element 248 may be centered and axially positioned on the opposite side by creating the axially convergent light point 249. These steps may be repeated thereafter with any further lens elements until the total lens assembly is complete.

It will be recognized that conventional centering and axial positioning techniques may be employed, but because manufacturing tolerances exist in even the most precisely made lenses and because these can be determined for the various cumulative combinations of lens elements, and because the phase plate 60 is fixed at the aperture stop, the use of the phase plate itself has particular advantages in this regard.

Figure 13:
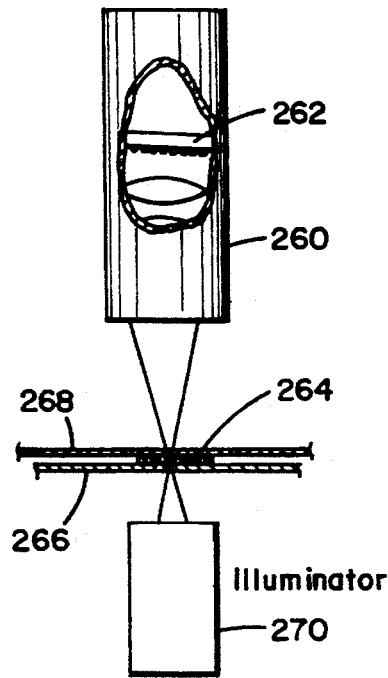
FIG. 13 is a side schematic view of an example of a system for high resolution microscopy in accordance with the invention.

Referring now to FIG. 13, the principal elements of a microscope 260 in accordance with the invention comprise a phase plate 262 at the aperture stop position within the microscope 260. The specimen 264 to be examined is disposed on a transparent substrate 266 and beneath a thin cover glass 268 of typically 0.18 thickness. An illuminator 270 in accordance with the invention directs a beam of spatially randomized, temporally coherent light containing multiple sources through the specimen 264 toward the objective of the microscope 260. The phase plate 262 design corrects spherical aberration in the refractive elements of the optical system and the monochromatic illumination obviates need for correction for lateral color. The cover glass 268 adds a characteristic spherical aberration to the impinging light, which can be compensated as well. There are further overall advantages in this application to microscopes, since special flat field objectives are often required for camera work and the spherical aberration correction enables far better correction for astigmatism and field flatness to be made.

In a paper entitled "The Axicon: A New Type of Optical Element" by J. H. McLeod, *Journal of the Optical Society of America*, August 1954, pp. 592–597, there is described a conical surface lens system which transforms a plane wavefront into a real or virtual line image collinear with the optical axis. The advantage of this type of system is that a very narrow conical light needle of substantial length is provided, eliminating the need for an autofocus system for many modern optical systems, such as optical storage read-out devices. The effect is achieved by the convergence and reinforcement of plane wavefronts which are refracted down from the axicon surface. The axial position of the line of light can be controlled by the aperture of the converging axicon element and the width or dimension of the line of light can be controlled by the numerical aperture or angle of convergence of the beams. However, because special conical and other aspheric surfaces are needed, the full capabilities of this type of optical system have not heretofore been realized.

Figure 14:
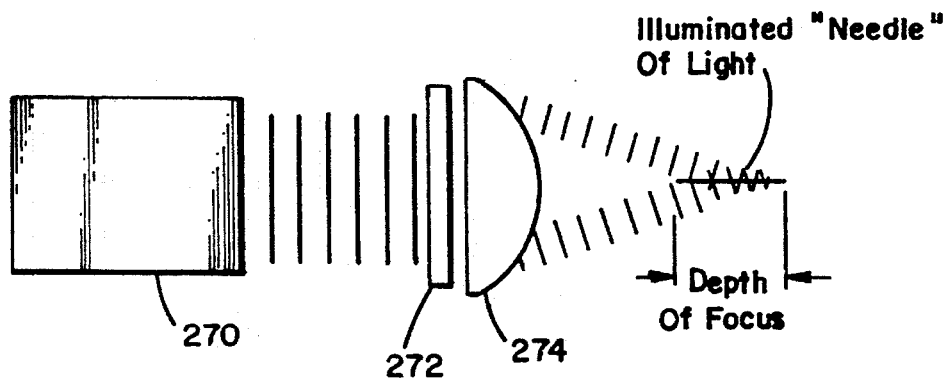
FIG. 14 is a side schematic view of an axicon-type system in accordance with the invention for providing a needle-like line of light along an axis.

In accordance with the invention, however, the axicon effect can be achieved utilizing an illuminator 270 in conjunction with a phase plate 272 and a spherical lens 274 (more than one refractive element can be utilized if desired). By arranging the multiple plateaus in the phase plate 272 to have substantially equal width and thickness, irrespective of radius, the effect of a conical lens is duplicated in conjunction with the spherical lens 274. Light bending at the phase plate is limited to about 3°. As seen in FIG. 14 the converging planar wavefronts give a usable depth of focus of substantial extent. It will also be appreciated that spherical aberration in the spherical lens 274 may be corrected, if desired, in the same phase plate 272 by introducing variations in the multi-plateau rings.

Figure 15:
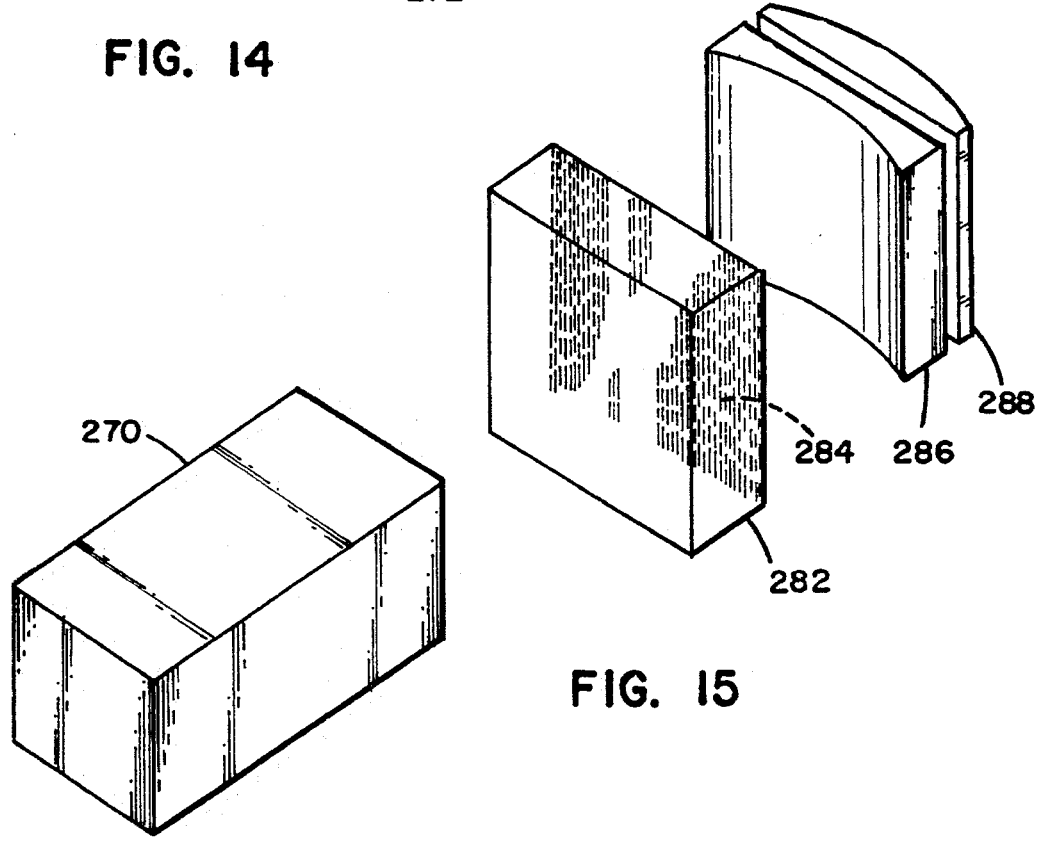
FIG. 15 is a simplified perspective view of a cylindrical lens system using a phase plate in accordance with the invention.
Figure 16:
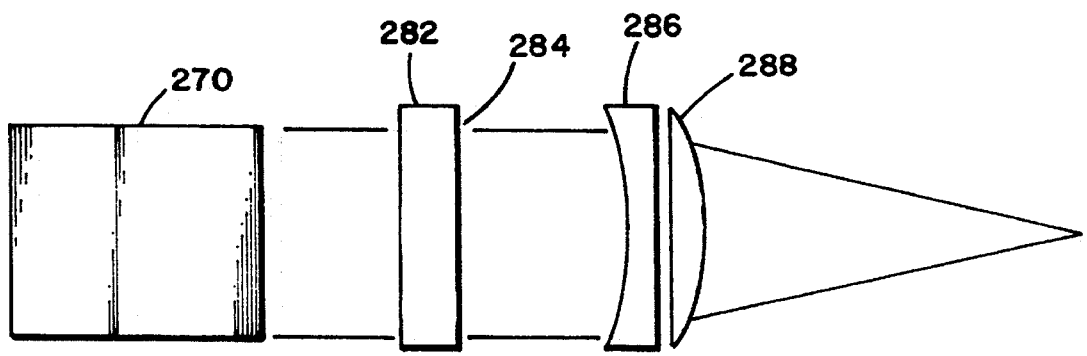
FIG. 16 is a plan view of the system of FIG. 15.

In FIGS. 15 and 16, application of concepts in accordance with the invention to a cylindrical lens system is shown. In such an application the illuminator 270 directs light of the prescribed characteristics through a phase plate 282 having multi-plateau variations 284 in the form of parallel lines of varying slopes and widths. The slopes and widths of the plateaus vary non-linearly relative to the central optical axis of a cylindrical lens set 286, 288 which is in the same optical path. Compensation by phase retardation for aberrations in the cylindrical lens set 286, 288 is introduced throughout the phase plate 282, in accordance with position relative to the optical axis.

It will also be appreciated that phase plates and cylindrical lens combinations can be made in which the phase plate approximates the action of a shallow prism or bi-prism which, in combination with a suitable light projector, will create sheets of light extending out from the optical system and lying in a plane which contains the axis of the cylinder.

Additionally this and other systems described above can function equally well both as imaging systems and as readout systems within the image fields thus created.

Although a number of expedients and modifications have been described it will be appreciated that the invention is not limited thereto but encompasses all forms and variations within the scope of the appended claims.

What is claimed is:

1. The method of controlling the coherence of an illumination beam during exposure of a light sensitive medium with a beam from a substantially coherent source so as to achieve improved resolution free of speckle effects and presenting an adequate number of wave sources distributed through an illumination area, comprising the steps of:

maintaining waves from the source temporally coherent for greater than about 10,000 waves;

sensing the partial coherence modulus in the beam prior to the illumination area and modifying the spatial coherence in accordance with the sensed partial coherence to randomize spatial coherence in a controlled manner without substantially affecting the temporal coherence.

2. The method of claim 1 above, further including the step of serially introducing two quasi-random phase variations across the beam area.

3. The method of claim 2 above, further including the step of varying the distance between the regions in which the phase variations are introduced.

4. The method of claim 1 above, wherein the spatial coherence is measured and controlled according to desired image conditions.

* * * * *